(12) United States Patent
Schreck

(10) Patent No.: US 12,283,305 B2
(45) Date of Patent: Apr. 22, 2025

(54) MAIN WORD LINE DRIVERS

(71) Applicant: MICRON TECHNOLOGY, INC., Boise, ID (US)

(72) Inventor: John Schreck, Boise, ID (US)

(73) Assignee: Micron Technology, Inc., Boise, ID (US)

(*) Notice: Subject to any disclaimer, the term of this patent is extended or adjusted under 35 U.S.C. 154(b) by 321 days.

(21) Appl. No.: 17/573,854

(22) Filed: Jan. 12, 2022

(65) Prior Publication Data
US 2023/0223069 A1 Jul. 13, 2023

(51) Int. Cl.
*G11C 11/40* (2006.01)
*G11C 11/408* (2006.01)

(52) U.S. Cl.
CPC ...... *G11C 11/4085* (2013.01); *G11C 11/4087* (2013.01)

(58) Field of Classification Search
CPC . G11C 11/4085; G11C 11/4087; G11C 5/025; G11C 8/08; G11C 8/10; G11C 8/14
See application file for complete search history.

(56) References Cited

U.S. PATENT DOCUMENTS

| | | | | |
|---|---|---|---|---|
| 4,987,560 A | * | 1/1991 | Hamano | G11C 8/10 365/225.7 |
| 5,742,554 A | * | 4/1998 | Fujioka | G11C 11/406 365/230.06 |
| 2023/0115230 A1 | * | 4/2023 | Raj | G11C 8/08 365/230.06 |

* cited by examiner

Primary Examiner — Jay W. Radke
(74) Attorney, Agent, or Firm — Dorsey & Whitney LLP

(57) ABSTRACT

In some examples, a main word line driver may include a transistor that is driven between an on state and a high resistance state by a signal based, at least in part, on a row address. In both states, the transistor may maintain a main word line in an inactive state. When in the high resistance state, the transistor may be overridden by a decoder that drives the main word line to an active state. In some examples, a main word line driver may include a transistor maintained in a high resistance state coupled in parallel with another transistor that may be driven between an on state and an off state by a signal based, at least in part, on a row address. When the other transistor is in the off state, the high resistance state transistor may be overridden by a decoder that drives a main word line to an active state.

10 Claims, 8 Drawing Sheets

MAIN WORD LINE DRIVERS

BACKGROUND

A semiconductor memory device, such as a Dynamic Random Access Memory (DRAM), includes a memory cell array having memory cells disposed at intersections between word lines (e.g., rows) and bit lines (e.g., columns). The semiconductor memory device may include hierarchical word line structure with main word lines (MWL) and subword lines (or simply word lines). The main word line is driven by a respective main word line driver (MWD) and is positioned at an upper hierarchy, and is selected by a first portion of a row address. The word line is driven by a respective subword line driver (SWD) and is positioned at a lower hierarchy, and is selected based on a corresponding main word line and word driver lines (FX), selected by a second portion of the row address. The word driver lines FX may be driven by word drivers (FXD). The word driver lines FX and word drivers FXD may also be referred to as phase driver lines and phase drivers, respectively. Both the MWL and FX must be driven to active states to select the desired subword line.

While a hierarchical word line structure may facilitate memory structures with certain advantages, such as reduced capacitance in the bit lines, the hierarchical word line structure may require additional circuitry compared to non-hierarchical structures. Accordingly, providing drivers with smaller and/or fewer components may be desirable.

DETAILED DESCRIPTION

Figure 1:
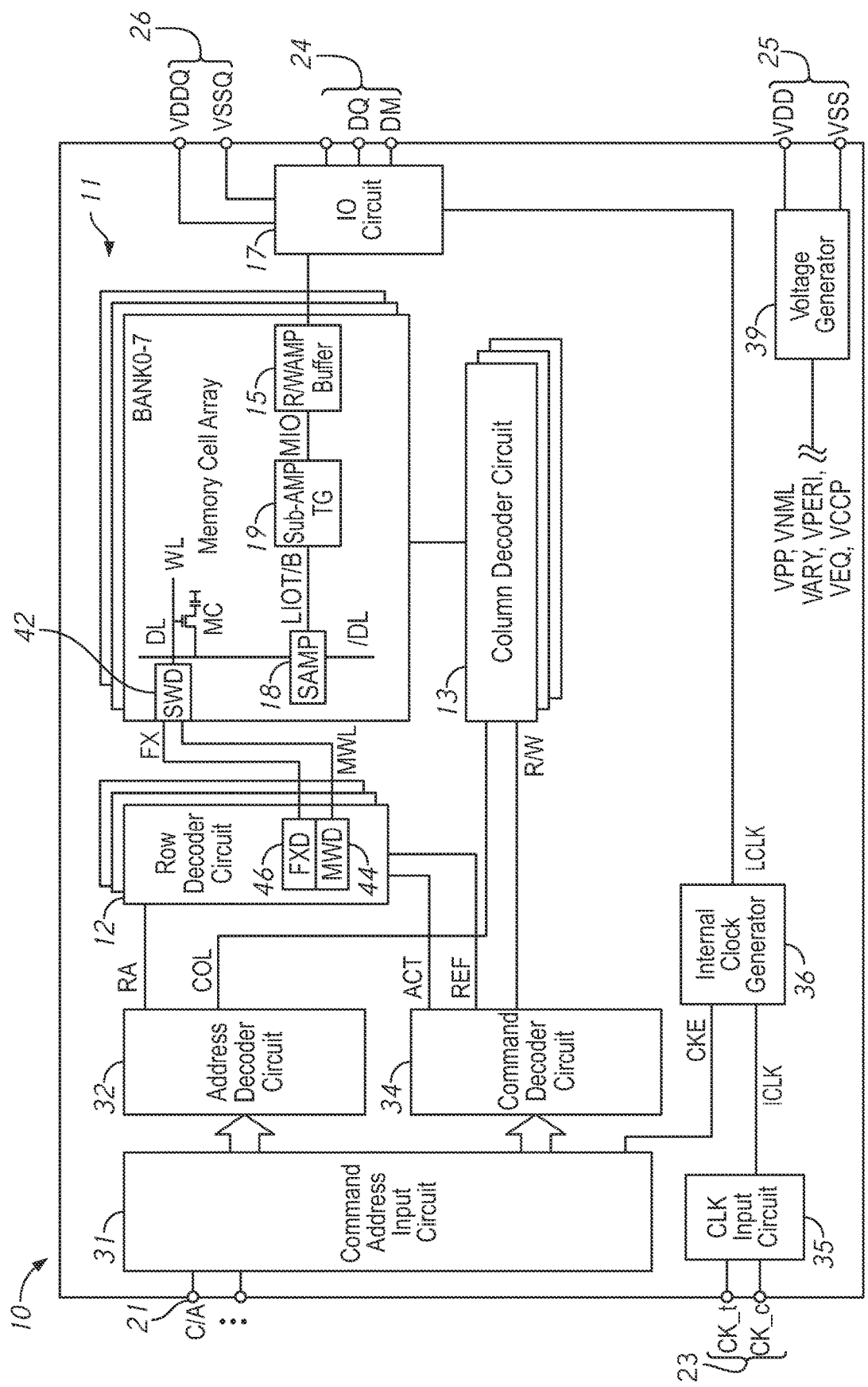
FIG. 1 is a block diagram of an apparatus according to at least one embodiment of the disclosure.

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components. Shapes and dimensions of the various semiconductor structures shown by the drawings are not to scale. For example, the layout diagrams are provided merely as examples, and the shapes and dimensions may be modified for an actual semiconductor device.

In memory devices with hierarchical word line structures, word lines coupled to rows of memory cells may be selected by activating multiple drivers, such as main word line drivers (MWD) that drive main word lines (MWL), and word drivers (FXD) that drive word driver lines (FX). These MWL and FX may activate subword line drivers (SWD) that activate a subword line (SWL), which may be the word line coupled to the row of memory cells. There may be several drivers for a memory array. For example, in some memory devices, there may be a MWD for every eight word lines. A memory device may include hundreds or thousands of word lines, and thus may include many MWDs. Accordingly, even small layout savings in the MWD may add up to a significant layout space reduction for the memory device in some applications.

Disclosed herein are MWDs that may include fewer components (e.g., fewer transistors) than current MWDs. The MWDs according to embodiments of the present disclosure may have a smaller layout area compared to current MWDs. Thus, including MWDs according to the present disclosure in memory devices may result in memory devices with reduced layout areas.

In some embodiments, a MWD may include a transistor that is driven between an 'on' state and a high resistance state by a signal based, at least in part, on a row address. In both states, the transistor may maintain a MWL in an inactive (e.g., unselected) state. When in the high resistance state, the transistor may be overridden by one or more other transistors that drive the MWL to an active (e.g., selected) state responsive to a signal based, at least in part, on the row address. In some embodiments, one or more of the other transistors may be included in a decoder. In some embodiments, a MWD may include a transistor maintained in a high resistance state coupled in parallel with another transistor that may be driven between an 'on' state and an 'off' state by a signal based, at least in part, on a row address. A MWL may be maintained in an inactive state regardless of whether the other transistor is off or on. When the other transistor is in the 'off' state, the high resistance state transistor may be overridden by one or more transistors that drive the MWL to an active state responsive to a signal based, at least in part, on the row address. By utilizing transistors in a high-resistance state to select and unselect the MWL, in some embodiments, fewer transistors may be needed to drive the MWL compared to existing MWD. When the MWD includes fewer transistors, the layout requirements of the MWD may be reduced compared to MWD with more transistors.

FIG. 1 is a block diagram of an apparatus according to at least one embodiment of the disclosure. The apparatus may be a semiconductor device 10, and will be referred to as such. The semiconductor device 10 may include, without limitation, a dynamic random access memory (DRAM) device in some embodiments of the disclosure. The semiconductor device 10 includes a memory cell array 11, which may be organized into one or more banks BANK0-7. Although the example memory cell array 11 shown in FIG. 1 includes eight banks, the memory cell array 11 may include any number of banks (e.g., 2, 4, 16 32). The memory cell array 11 includes a plurality of word lines WL and a plurality of data lines DL and/DL (e.g., bit lines) that intersect with each other, with memory cells (MC) disposed at the intersections. The WLs may be driven by respective subword line drivers SWD 42. Thus, the word lines WL may also be referred to as subword lines (SWL). For clarity, only one WL, SWD, DL, and MC are shown in FIG. 1.

In some examples, the semiconductor device 10 may include one or more row decoder circuits 12 and multiple column decoder circuits 13. In some examples, each row decoder circuit 12 and column decoder circuit 13 are coupled to a respective bank of the memory cell array 11. In some embodiments, each row decoder circuit 12 may include word line drivers (MWD) 44 and word drivers (FXD) 46. For clarity, only one MWD 44 and FXD 46 are shown in FIG. 1. A plurality of main word lines MWL and word driver lines FX may be provided to respective SWDs 42 in the memory cell array 11. In some embodiments, selection of a main word line MWL and a word driver line FX is carried out by the row decoder circuit 12, and the selection of the data line DL is carried out by a column decoder circuit 13. In some examples, the word driver lines FX may be driven by respective word drivers FXD 46. The main word lines MWL may be driven by respective main word line drivers (MWD) 44.

Returning to the memory array 11, the digit lines DL and/DL are coupled to a respective sense amplifier (SAMP) 18. Read data from the digit lines DL or/BL is amplified by the sense amplifier SAMP 18, and transferred to read/write amplifiers and buffers 15 over complementary local data lines (LIOT/B), sub-amplifier transfer gate (TG) 19, and complementary main data lines (MIOT/B). Conversely, write data outputted from the read/write amplifiers 15 is transferred to the sense amplifier SAMP 18 over the complementary main data lines MIOT/B, the transfer gate TG 19, and the complementary local data lines LIOT/B, and written in the memory cell MC coupled to the digit line DL or/DL.

Turning to the explanation of a plurality of external terminals included in the semiconductor device 10, the plurality of external terminals includes command and address terminals (C/A) 21, clock terminals (CK_t, CK_c) 23, data and data mask terminals (DQ and DM) 24, and power supply terminals 25 and 26. The command and address terminals 21 are supplied with command and address signals C/A. The C/A signals provided to the command and address terminals 21 include commands and addresses. Addresses included in the C/A signals are transferred via a command/address input circuit 31 to an address decoder circuit 32. The address decoder circuit 32 receives the addresses and supplies a decoded row address signal RA to the row decoder circuit 12, and a decoded column address signal COL to the column decoder circuit 13.

Commands included in the C/A signals provided to the command and address terminals 21 are input to a command decoder circuit 34 via the command/address input circuit 31. The command decoder circuit 34 decodes the commands to provide various internal command signals. For example, the internal commands may include a row command signal to select a word line and a column command signal, such as a read command or a write command, to select a data line.

When an activation command is issued and a row address is timely supplied with the activation command, and a column address is timely supplied with a read command, read data is read from a memory cell MC in the memory cell array 11 designated by these row address and column address. More specifically, the row decoder circuit 12 selects a main word line MWL, word driver line FX, and word line WL indicated by the row address RA so that the associated memory cell MC is subsequently connected to the data line DL. Further, when the memory cell MC is selected by the row address and the associated row is activated by the activation command, the main word line MWL may be active and the word driver line FX may be active. This results in the word line WL being active. Conversely, when the memory cell MC is not selected, e.g., in a precharge operation, the word driver line FX may be inactive, and/or the main word line MWL may be inactive. This drives the word line WL to a non-active potential (e.g., unselected state), such as potential VNWL. With further reference to FIG. 1, the read data DQ is output externally from the data terminals 24 via a read/write amplifier 15 and an input/output circuit 17.

Similarly, when the activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address by activating the appropriate word line WL via the MWL and FX lines.

The clock terminals 23 are supplied with external clock signals CK_t and CK_c, respectively. These external clock signals CK_t and CK_c are complementary to each other and are supplied to a clock input circuit 35. The clock input circuit 35 receives the external clock signals CK_t and CK_c and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31. In a non-limiting example, a DLL circuit can be used as the internal clock generator 36. The phase controlled internal clock signal LCLK is supplied to the input/output circuit 17 and is used as a timing signal for determining an output timing of the read data DQ.

The power supply terminals 25 are supplied with power supply potentials VDD and VSS. In some embodiments, VSS may be used by one or more components of the semiconductor device 10 as a common potential (e.g., ground). These power supply potentials VDD and VSS are supplied to an internal potential generator circuit 39. The internal potential generator circuit 39 provides various internal potentials, such as, VPP, VARY, VPERI, VEQ, VCCP, and VNWL.

The internal potentials VCCP, VNWL are potentials to be mainly used in the row decoder circuit 12, the main word line drivers MWD 44 and the word drivers FXD 46. For example, a word driver (a.k.a. phase driver) FXD, when selected based upon the address signal ADD, may be configured to drive a potential on the word driver line (a.k.a. phase driver line) FX to a VCCP level corresponding to a high potential (e.g., 3.1 V). When a row is in pre-charge state, an associated subword line driver, responsive to an inactive signal on a main word line (MWL) (e.g., the MWL is unselected) and an inactive signal on a word driver line FXT, FXF, may be configured to pull down the word line (WL) to the internal potential VNWL (e.g., a non-active potential, which may be a negative potential in some embodiments). In some embodiments, the MWD 44 may drive the MWL to an active low state when the MWL is selected (e.g., based on row address RA). In some embodiments, the potential of the MWL in the active low state may be at or near VSS. When the MWL is not selected, the MWD 44 may drive the MWL to an inactive high state. In some embodiments, the potential of the MWL in the inactive high state may be at or near VCCP.

The internal potential VARY and VEQ are potentials to be used by the sense amplifier 18, transfer gates 19 and/or read/write amplifiers 15. When the sense amplifier 18 is activated, the read data read out is amplified by driving one of the paired data lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However the dedicated power supply potentials VDDQ and VSSQ may be used for the input/output circuit 17 so that power supply noise generated by the input/output circuit 17 does not propagate to the other circuit blocks of device 10.

Figure 2:
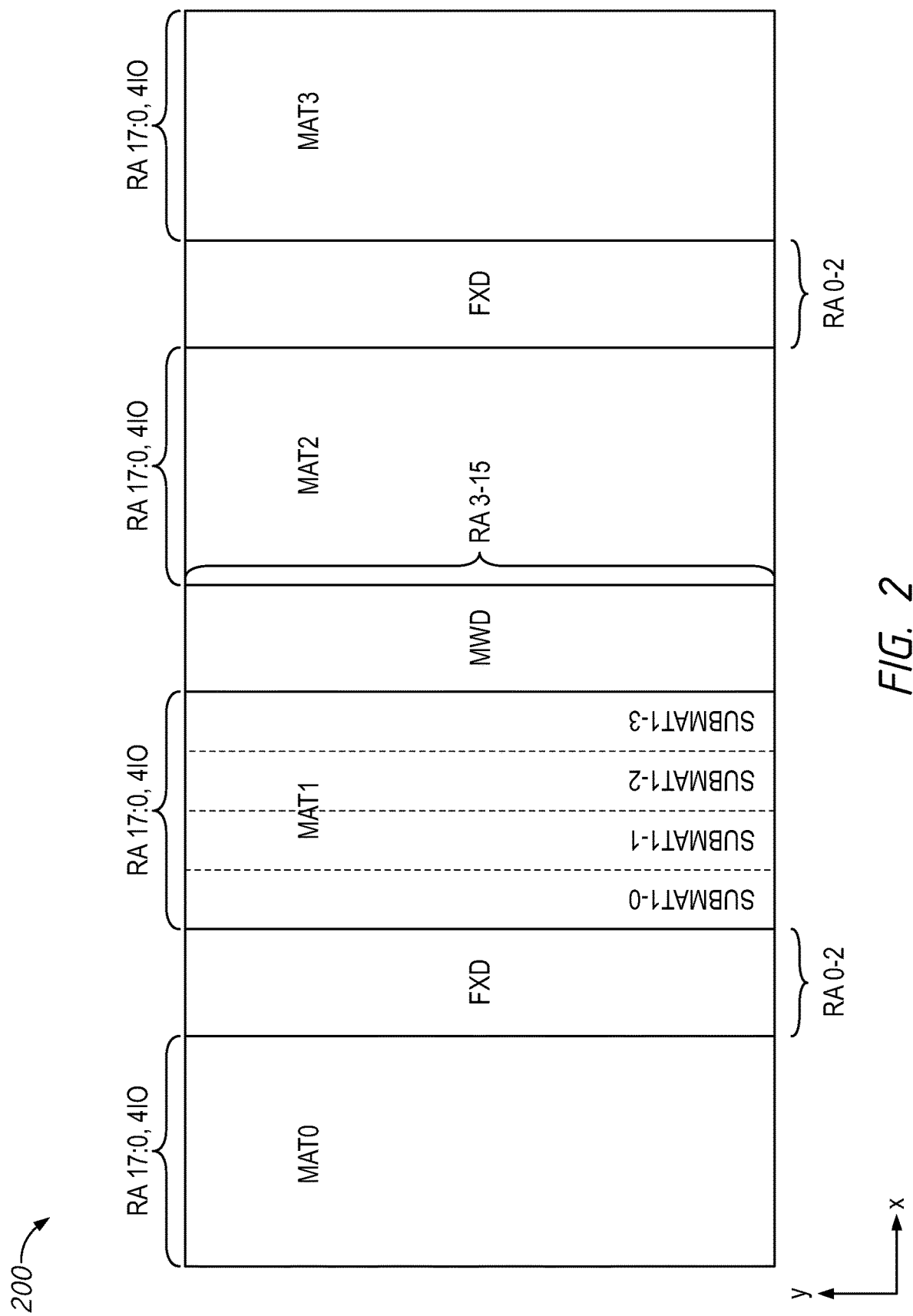
FIG. 2 is a diagram of an example configuration of a memory bank of a semiconductor device according to some examples described in the disclosure.

FIG. 2 is a diagram of an example configuration of a memory bank of a semiconductor device according to some examples described in the disclosure. For example, each of the banks BANK0-7 of the memory cell array 11 of the device 10 (FIG. 1) may include a configuration of the bank 200 of FIG. 2 in some embodiments of the disclosure.

In some examples, the memory bank 200 may include a plurality of memory mat regions, such as MAT0-3. In the example shown in FIG. 2, the bank 200 has four memory mat regions, but the bank 200 may include more or fewer memory mat regions in other examples. As indicated by the dotted lines in memory mat region MAT1, each memory mat region may be divided into multiple sub-regions, e.g., SUBMAT1-0-3. While the example shown in FIG. 2 includes four sub-regions, memory mat regions MAT0-3 may include more or less sub-regions in other examples. Each sub-region SUBMAT1-0-3 may include a plurality of memory mats (e.g., 64). For clarity, the individual memory mats are not shown in FIG. 2. Subword line driver SWD blocks (not shown in FIG. 2, see SWD 42 in FIG. 1) may be disposed on the two sides of each memory mat. Sense amplifier blocks may be disposed on the two sides of each memory mat (not shown in FIG. 2, see SAMP 18 in FIG. 1). The memory mats of each sub-region SUBMAT1-0-3 may be provided to a corresponding IO (e.g., DQ pad) in some embodiments.

The subword line driver operations may be controlled by a row decoder circuit, for example, the row decoder circuit 12 of FIG. 1. When receiving a row address RA, the row decoder selects a word line WL by activating an appropriate main word line driver MWD and an appropriate word driver FXD indicated by the row address RA. In the example shown in FIG. 2, one block is shown for the main word line driver MWD, however, the main word line driver MWD block may include a plurality of main word line drivers MWD. Similarly, two blocks are shown for the word drivers FXD, but each word driver FXD block may include a plurality of word drivers FXD. For example, if each memory mat region MAT includes four sub-regions and each sub-region includes 64 memory mats, the main word line driver MWD block may include 128 MWD, each configured to activate a corresponding main word line MWL. Continuing this example, each word driver FXD block may include eight word drivers FXD, each configured to activate a corresponding word driver line FX. In the example shown in FIG. 2, bits 3-15 of the row address RA encode the main word line MWL and bits 0-2 of the row address RA encode the word driver line FX. However, other encoding schemes may be used.

Figure 3:
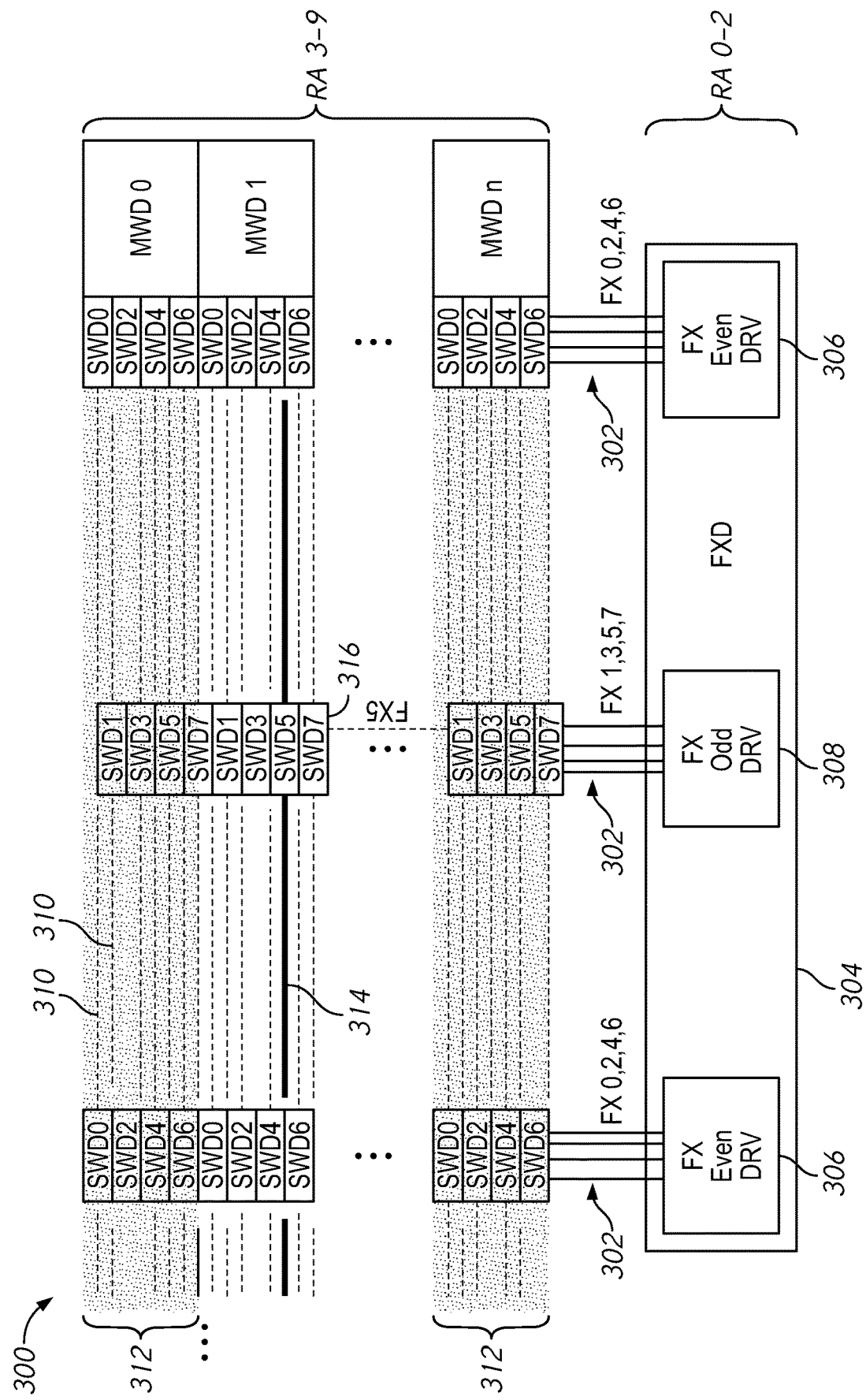
FIG. 3 is a schematic diagram of a portion of a memory bank according to some examples described in the disclosure.

FIG. 3 is a schematic diagram of a portion of a memory bank 300 according to some examples described in the disclosure. In some embodiments of the disclosure, a portion of a bank 300 shown in FIG. 3 may be included in the bank 200 of FIG. 2, and/or the memory cell array 11 of FIG. 1.

The portion of memory bank 300 may include multiple word lines 310, each provided by a respective subword line driver SWDj 316. For example, a word line 314 may be provided by a corresponding subword line driver SWD5 associated with a main word line driven by a main word line driver MWD1 and also associated with a word driver line 302 (e.g., FX5) associated with a word driver 308. In other words, for each subword line driver 316, a corresponding main word line MWL and word driver line FX and non-active potential (e.g., off-state word line potential VNWL) are provided. The signals on the main word lines MWL and the word driver lines FXs may be provided by main word line drivers MWD0-N and word drivers FXDs 304, based upon the row address RA as described with reference to FIG. 2.

A main word line MWL may extend over array regions of a respective memory mat to provide the main word signal to the subword line driver rows SWD0-7 of the memory mat to activate those subword line drivers SWD0-7. That is, when a main word line driver MWD is activated, it may provide active main word line signals to all the subword line drivers SWD0-7 of the mat. As will be described below, a word driver line FX may include FXT and FXF. In some examples, when the FXT is active, the FXF line is inactive. Conversely, the FXF may be active while the FXT is inactive. Each word driver line 302 of word driver FXD 304 provides word driver lines to at least one subword line driver SWD in each mat. In the example shown in FIG. 3, the word driver FXD 304 includes even word drivers 306 and odd word drivers 308. The even word drivers 306 provide respective word driver lines to even-numbered subword line drivers SWD0, SWD2, SWD4, and SWD6, of each memory mat and odd word drivers 308 provide respective word driver lines to odd-numbered subword line drivers SWD1, SWD3, SWD5, and SWD7 of each memory mat. However other arrangements may be used in other examples. In the example shown in FIG. 3, each word driver line of the word driver FXD 304 may be coupled to a corresponding subword line driver SWD0-7 in each memory mat. For example, FX line 5 may be coupled to the subword line driver SWD5 of each memory mat.

In the example operation shown in FIG. 3, a row address RA has indicated MWD1 should be activated and odd word driver 308 associated with word driver line FX 5 should be activated. As shown by the shaded regions 312, word lines 310 associated with the inactive main word line drivers MWD0, MWDn remain inactive, even the subword lines associated with word driver line FX 5 are active. However, among the word lines 322 that are associated with activated MWD1, the word line 314 driven by subword line driver SWD5 associated with activated MWD1 and FX 5 is activated. By way of example, an activated MWD may be configured to provide an active signal on the associated main word line (e.g., by driving the MWL to an active potential), and an activated word driver FXD may be configured to provide an active signal on the word driver line (e.g., FXT, FXF). Similarly, an activated subword line driver may be configured to provide an active signal on the associated word line. Thus, a selected word line WL of the selected memory mat associated with MWD1 is driven to the active potential by the corresponding activated subword line driver SWD5.

In some examples, the other subword line drivers SWD of the selected memory mat drive the respective unselected word lines WL to the non-active potential (e.g., VNWL) to remain inactive. Subword line drivers SWD of unselected memory mats MAT (e.g., memory mats associated with MWD0 and MWDn) remain deactivated, and the word lines WL of the unselected memory mats MAT are not provided a potential, or instead, provided with a non-active potential (e.g., VNWL) in some examples. Whereas a subword line driver SWD is coupled to a word driver FXD and a main word line driver MWD, in order for a word line WL associated with the subword line driver SWD to be activated, both the associated word driver FXD and the main word line driver MWD must be activated. In some examples, unselected main word line drivers may drive their corresponding main word lines to inactive potentials (e.g., provide inactive main word line signals). Unselected word drivers may also drive their respective word driver lines to inactive potentials in some embodiments.

Figure 4:
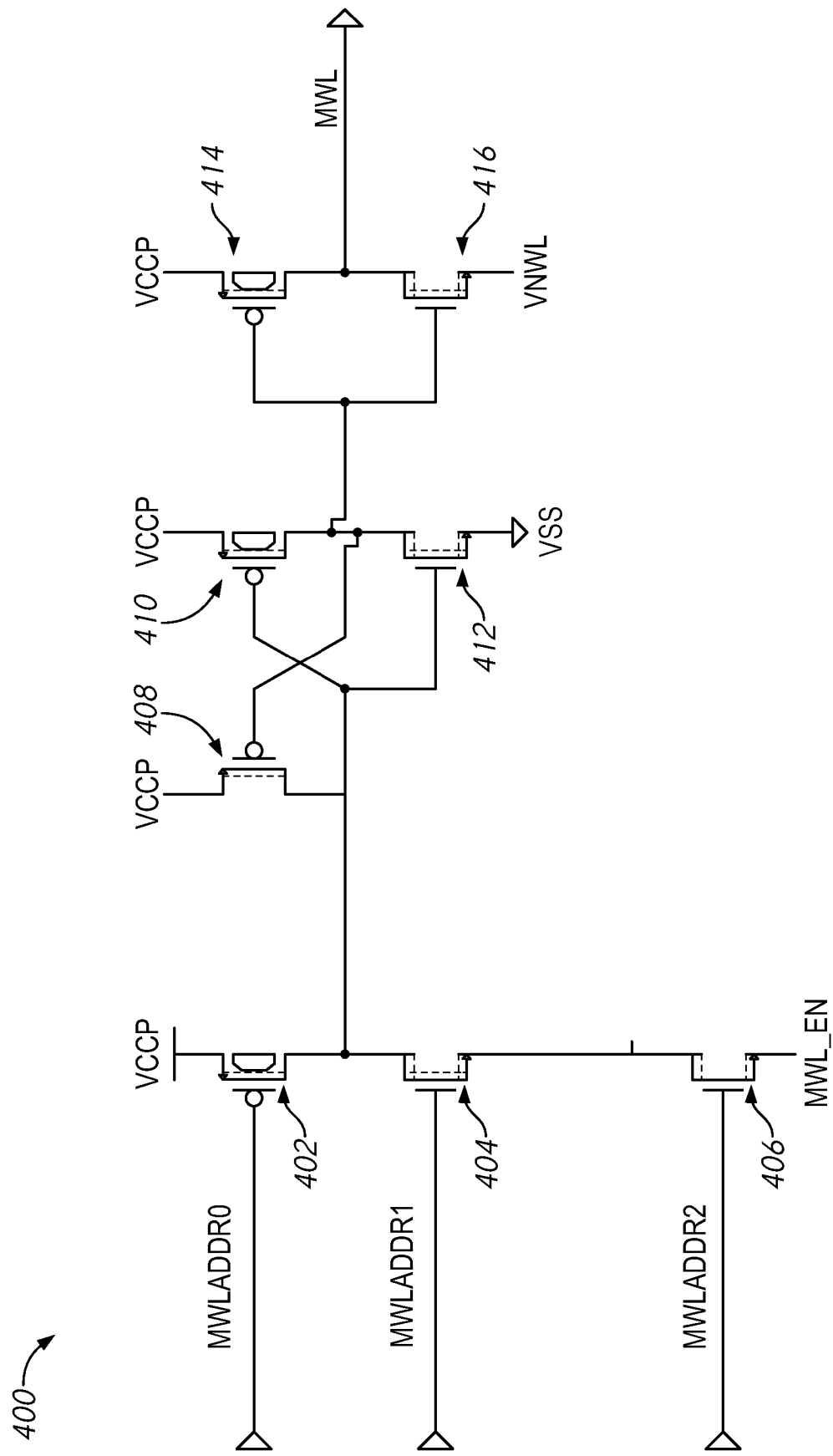
FIG. 4 is a circuit diagram of a main line word driver.

FIG. 4 is a circuit diagram of a main word line driver (MWD). As described, the MWD 400 drives the main word line MWL to a low potential when selected (e.g., active low) and drives the MWL to a high potential when not selected (e.g., inactive). The MWL may provide the low and high potential signals to a subword driver (not shown in FIG. 4).

The MWD 400 may receive multiple control signals: address signals MWLADDR0-2 and enable signal MWL_EN. One or more of the control signals may be based, at least in part, on an address received with a memory access command (e.g., a row address RA). MWD 400 may include transistors 402, 404, and 406, which receive the control signals. While four control signals MWLADDR0-2, MWL_EN and three transistors 402, 404, and 406 are shown in the example MWD 400 shown in FIG. 4, the number of transistors receiving the control signals and the number of control signals may vary depending on the word line encoding scheme used by the memory device.

The MWD 400 further includes transistors 408, 410, 412, 414, 416 that are coupled between high potentials (e.g., VCCP) and low potentials (e.g., VSS, VNWL). Responsive to the control signals received, the transistors 402, 404, and 406 may cause the transistors 408, 410, 412, 414, and 416 to cause the main word line MWL to be driven to a high potential (e.g., at or near VCCP) or a low potential (e.g., at or near VSS or VNWL). For example, when the control signals indicate the MWL is selected, the transistors of MWD 400 may drive the MWL to an active low level. When the control signals indicate the MWL is not selected, the transistors of MWD 400 may drive the MWL to an inactive high level. The MWL may be coupled to a SWD (not shown in FIG. 4).

The example MWD 400 shown in FIG. 4 requires at least eight devices to drive the MWL to the desired level. In some applications, the transistors may range in size from approximately 280-800 nm or larger. Accordingly, reducing a number of transistors in a MWD may reduce a layout area required for the MWD.

Figure 5:
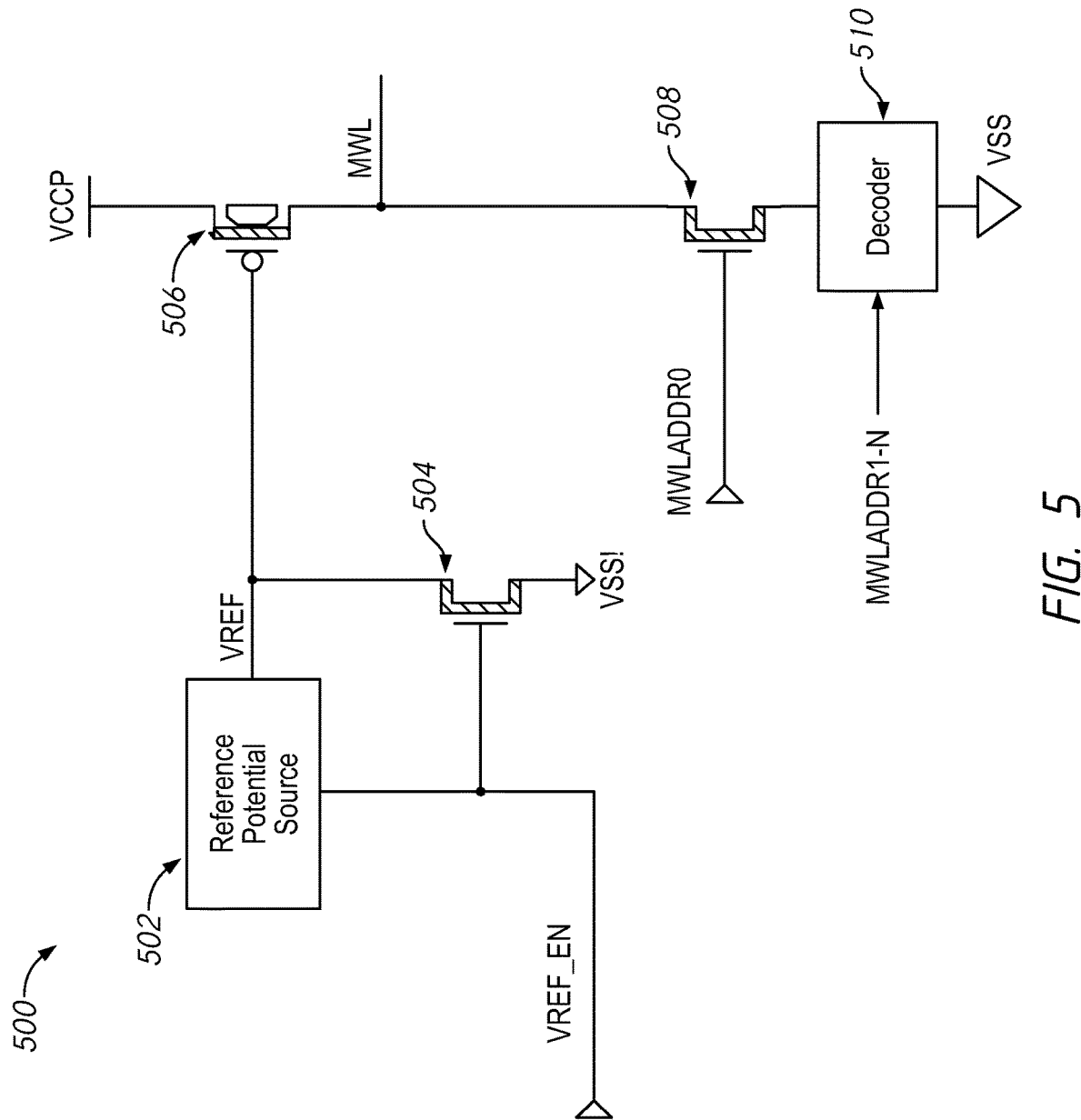
FIG. 5 is a main word line driver according to at least one embodiment of the present disclosure.

FIG. 5 is a main word line driver (MWD) according to at least one embodiment of the present disclosure. In some embodiments, the MWD 500 may be used to implement the MWD 44 shown in FIG. 1, the MWD shown in FIG. 2, and/or MWD 0-n shown in FIG. 3. The MWD 500 may include a reference potential source 502 and transistors 504, 506, and 508.

Reference potential source 502 may provide a reference potential VREF. In some embodiments, the reference potential source 502 may be implemented by a current mirror. In some embodiments, the reference potential source 502 may include a potential generator, such as potential generator 39, or a separate potential generator that generates the reference potential based on a potential received from potential generator 39. Although shown as a portion of MWD 500, in some embodiments, reference potential source 502 may be a separate component from MWD 500. In some embodiments, the reference potential source 502 may be shared between multiple MWD 500. The reference potential VREF may be provided to a gate of transistor 506. Transistor 506 may be coupled between a high potential (e.g., VCCP) and the main word line MWL. In some embodiments, such as the one shown in FIG. 5, the transistor 506 may be a P-channel device.

In some embodiments, the reference potential source 502 and the gate of transistor 504 may receive an enable signal VREF_EN. In some embodiments, such as the one shown in FIG. 5, the transistor 504 may be an N-channel device. Transistor 504 may be coupled between the gate of transistor 506 and a low potential (e.g., VSS). In some embodiments, when VREF_EN is high, the reference potential source 502 is disabled (e.g., a transistor or switch may be in an 'off' state, disconnecting VREF from transistor 506). The high VREF_EN signal may turn on transistor 504, driving the line coupled to the gate of transistor 506 to the low potential. This may cause transistor 506 to enter a low resistance or 'on' state. When transistor 506 is in a low resistance or 'on' state, the main word line MWL may be driven to a high potential (e.g., VCCP) or inactive state.

When VREF_EN is low, the reference potential source 502 is enabled (e.g., a transistor or switch may be in an 'on' state, coupling VREF to the gate of transistor 506) and transistor 504 may be in an 'off' state (e.g., anon-conductive state). This may couple the gate of transistor 506 to reference potential VREF. VREF may be a potential sufficient to set transistor 506 to a high resistance—but not 'off' state. The magnitude of the potential of VREF may be based, at least in part, on the properties of transistor 506, such as threshold voltage (Vt) and channel length. For example, the potential of VREF may be selected to be slightly greater than the threshold voltage of transistor 506. When transistor 506 is in the high resistance state, the potential (and state) of MWL may depend, at least in part, on a state of transistor 508.

Transistor 508 may be coupled between the main word line MWL and a low potential (e.g., VSS). Transistor 508 may be an N-channel device in some embodiments, such as the embodiment shown in FIG. 5. In some embodiments, such as the one shown in FIG. 5, transistor 508 may be coupled to the low potential via a decoder 510. In some embodiments, the decoder 510 may include a decoder tree. Any suitable decoder tree may be used, for example, the decoder tree described in U.S. Pat. No. 5,986,946. In some embodiments, transistor 508 may be the "top" transistor of the decoder tree of decoder 510. The decoder 510 may include one or more transistors. Furthermore, although a decoder tree is used in the examples described herein, other decoder types may be used in other examples.

Transistor 508 and/or decoder 510 may receive one or more address signals MWLADDR0-N, which may be based, at least in part, on a row address, such as row address RA described with reference to FIGS. 1-3. For example, each address signal MWLADDR0-N may represent a bit of a multi-bit row address. However, other correspondence between the bits of the row address RA and address signals may be different in other examples. When address signals MWLADDR0-N indicate the MWL is selected, MWLADDR0 may be high, which may cause transistor 508 to be in an 'on' state, driving the MWL to the low potential.

In embodiments including the decoder 510, the remaining address signals MWLADDR1-N may cause the decoder 510 to drive the MWL to the low potential through transistor 508 (e.g., the decoder 510 may couple transistor 508 to the low potential) if transistor 508 is in an 'on' state. For example, the decoder 510 may include one or more transistors that are 'on' or 'off' based on the address signals MWLADDR1-N such that the MWL is driven to the low potential. In contrast, when the address signals MWLADDR1-N indicate that the MWL is not selected, the decoder 510 may disconnect transistor 508 from the low potential.

In some embodiments, the enable signal VREF_EN may be based, at least in part, on address information, such as the row address RA. For example, enable signal VREF_EN may represent one bit of the row address RA in some embodiments or the state of the enable signal VREF_EN may be based one or more bits of the row address RA. Thus, the transistor 506 may be considered "partially decoded" by the enable signal VREF_EN. The remaining decoding may be performed by transistor 508 and/or decoder 510. When VREF is provided to transistor 506, transistor 506 acts as a weak static pull-up device in the high resistance state. In operation, when acting as a weak static pull-up device, the MWL may be driven to a high potential/inactive state. However, when transistor 508 and/or decoder 510 receive additional address signals MWLADDR0-N indicating the MWL is selected, the transistor 508 and decoder 510 may "override" the transistor 506 to couple the MWL to the low potential. When the transistor 508 and/or decoder 510 couple the MWL to the low potential, the MWL is driven to the low potential/active state.

As shown in FIG. 5, the number of transistors included in MWD 500 to drive the MWL between an active state (e.g., VSS) and inactive state (e.g., VCCP) is less than the number of transistors used to drive the MWL between in MWD 400. In some applications, the layout of MWD 500 may be approximately 12 square microns whereas the layout of MWD 400 is approximately 15 square microns, a reduction in layout size of approximately 20%.

While the MWD 500 may provide significant layout reductions in some applications, in some situations, transistor 506 may exhibit unpredictable behavior if there are threshold voltage (Vt) variations in transistor 506, which may be due to temperature, hot carrier injection, and/or other factors. Vt variations may cause the transistor 506 to inadvertently switch to an 'off' state in response to the reference potential VREF rather than enter the high resistance state. Accordingly, in some applications, a more robust design may be desired.

Figure 6:
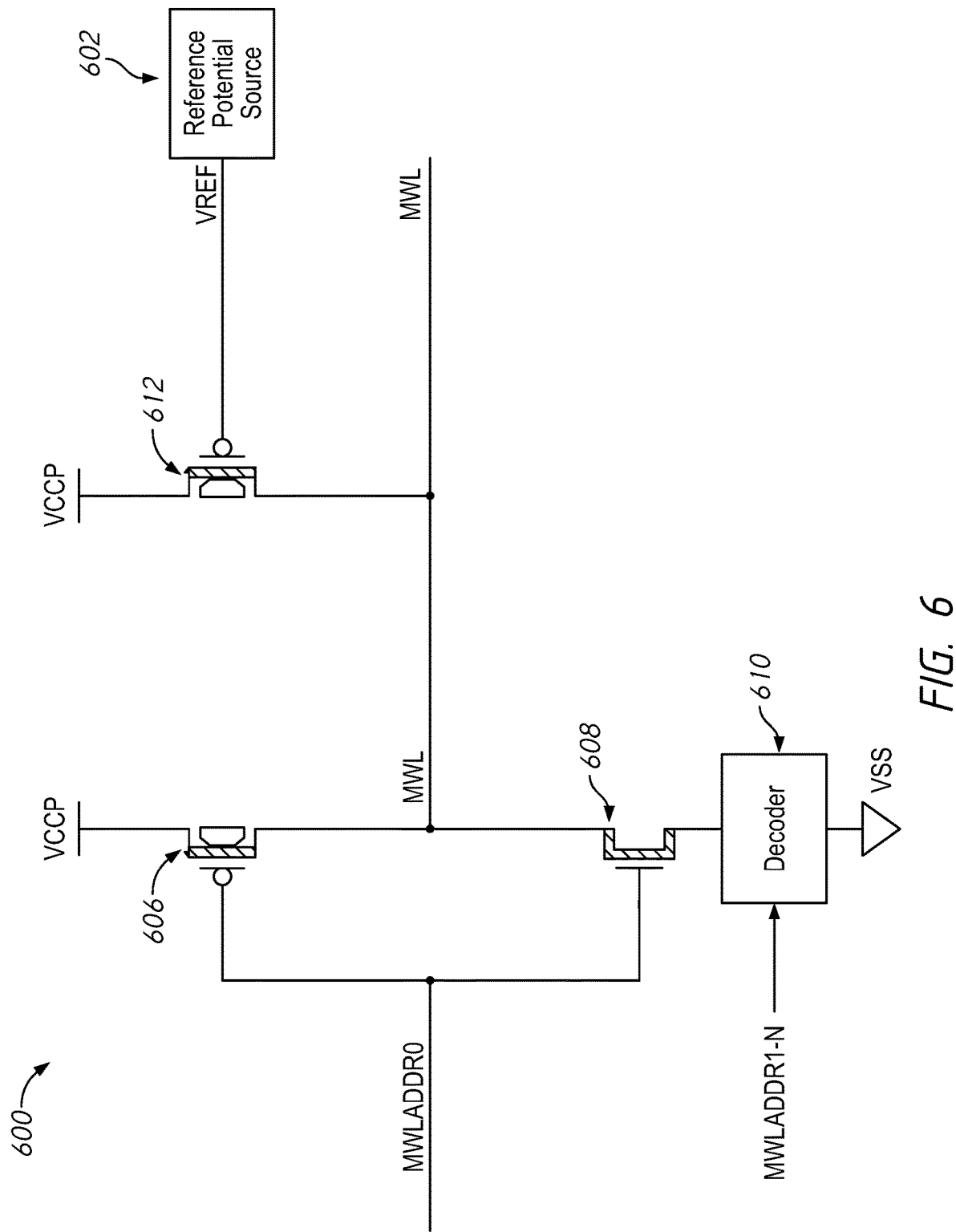
FIG. 6 is a main word line driver according to at least one embodiment of the present disclosure.

FIG. 6 is a main word line driver (MWD) according to at least one embodiment of the present disclosure. In some embodiments, the MWD 600 may be used to implement the MWD 44 shown in FIG. 1, the MWD shown in FIG. 2, and/or MWD 0-$n$ shown in FIG. 3. The MWD 600 may include a reference potential source 602, and transistors 606, 608, and 612. In contrast to MWD 500 shown in FIG. 5, the MWD 600 of FIG. 6 includes a partially decoded transistor 606 that has a gate driven between a high potential (e.g., VCCP) and a low potential (e.g., VSS) rather than between a reference potential and a low potential as with transistor 506 of MWD 500. Thus, unlike MWD 500, the partially decoded transistor may be driven to an 'off' state (e.g., non-conductive state) rather than a high resistance state.

Transistor 606 may be coupled between a high potential (e.g., VCCP) and a main word line MWL. In some embodiments, transistor 606 may be a P-channel device. The transistor 606 may receive an address signal MWLADDR0. In some embodiments, the address signal MWLADDR0 may be based, at least in part, on a row address, such as row address RA described in reference to FIGS. 1-3. For example, based one or more bits of the row address, MWLADDR0 may be high (e.g., provide a potential of VCCP) or low (e.g., provide a potential of VSS). Thus, transistor 606 may be referred to as "partially decoded" similar to transistor 506. When the address signal MWLADDR0 is low, transistor 606 may be 'on' and drive the main word line MWL to an inactive high potential, such as VCCP in the example shown in FIG. 6. When the address signal MWLADDR0 is high, the potential provided to the gate of transistor 606 may be sufficient for transistor 606 to be in an 'off' state rather than a high resistance state.

The MWD 600 further includes a transistor 612 coupled in parallel with the transistor 606 between the high potential and the MWL. The gate of transistor 612 may receive a reference potential VREF from a reference potential source 602. In some embodiments, the reference potential source 602 may be implemented by a current mirror. In some embodiments, the reference potential source 602 may include a potential generator, such as potential generator 39, or a separate potential generator that generates the reference potential based on a potential received from potential generator 39. Although shown as a portion of MWD 600, in some embodiments, reference potential source 602 may be a separate component from MWD 600. In some embodiments, the reference potential source 602 may be shared between multiple MWD 600. VREF may be a potential sufficient to maintain transistor 612 in a high resistance—but not 'off' state. Thus, rather than transistor 606, transistor 612 may act as a weak static pull-up device in some embodiments. The magnitude of the potential of VREF may be based, at least in part, on the properties of transistor 612.

The address signal MWLADDR0 may be provided to a gate of transistor 608. Transistor 608 may be coupled between the main word line MWL and a low potential (e.g., VSS). Transistor 608 may be coupled to the low potential via a decoder 610. In some embodiments, the decoder 610 may include a decoder tree. Any suitable decoder tree may be used, such as those similar to ones suitable for decoder 510. In some embodiments, transistor 608 may be the "top" transistor of the decoder tree of decoder 610. The decoder 610 may include one or more transistors. Furthermore, although a decoder tree is used in the examples described herein, other decoder types may be used in other examples. In some embodiments, some or all of the decoder 610 may be shared between multiple MWD 600. The decoder 610 may receive one or more address signals MWLADDR1-N. Address signals MWLADDR0-N, which may be based, at least in part, on a row address, such as row address RA described with reference to FIGS. 1-3. For example, each address signal MWLADDR1-N may represent a bit of a multi-bit row address. However, other relationships between the address signals and the row address may be used in other examples.

When the address signals MWLADDR0-N indicate the main word line MWL is selected, MWLADDR0 may be high, transistor 606 may be 'off' and transistor 608 may be 'on.' This may drive the main word line MWL to the low potential. In embodiments including the decoder 610, the remaining address signals MWLADDR1-N may cause the decoder 610 to drive the MWL to the low potential when transistor 608 is on by coupling transistor 608 to ground. For example, the decoder 610 may include one or more transistors that are 'on' or 'off' based on the address signals MWLADDR1-N such that the MWL is driven to the low potential. Similar to MWD 500, the transistor 608 and/or decoder 610 may override the weak static pull-up transistor 612. This may cause MWL to be driven to the low potential (e.g., active state). In contrast, when the address signals MWLADDR1-N indicate that the MWL is not selected, the decoder 610 may disconnect transistor 608 from the low potential, allowing transistor 606 and/or transistor 612 to drive MWL to the inactive state.

In some applications, the space savings of MWD 600 compared to MWD 400 may be less than that for MWD 500. However, in some applications, MWD 600 may be less prone to errors caused by Vt variations than MWD 500. Thus, in some applications where robustness is prioritized over layout size, MWD 600 may be preferable. However, when layout size is the highest priority, MWD 500 may be preferable.

Figure 7:
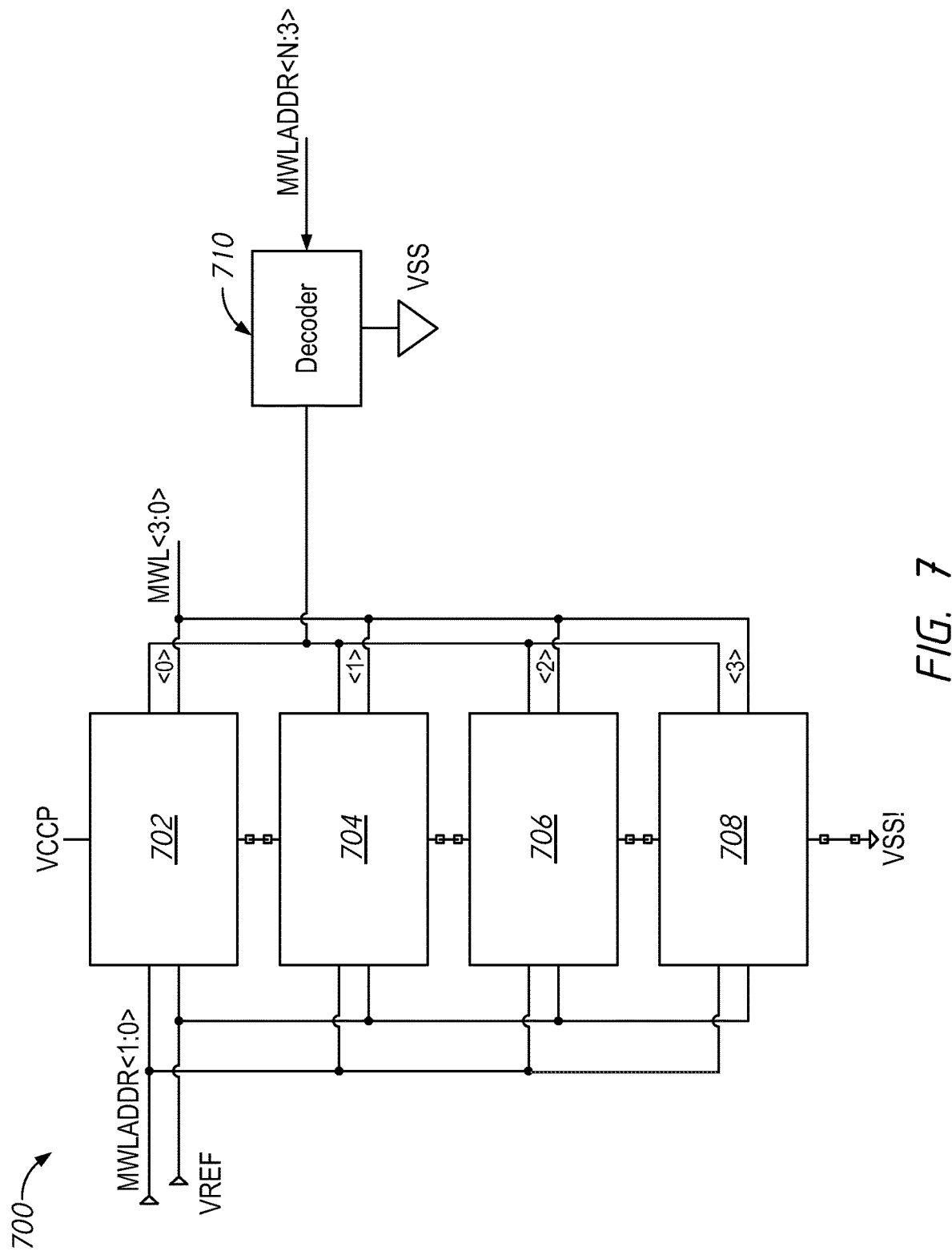
FIG. 7 is a portion of a row decoder circuit according to at least one embodiment of the present disclosure.

FIG. 7 is a portion of a row decoder circuit according to at least one embodiment of the present disclosure. In some embodiments, row decoder circuit 700 may be included in row decoder circuit 12 shown in FIG. 1. The portion of row decoder circuit 700 shown in FIG. 7 includes main word line drivers MWD 702, 704, 706, and 708 and decoder 710. The MWD 702-708 may be implemented by MWD 500 and/or MWD 600 in some embodiments. The decoder may be implemented by decoder 510 and/or decoder 610 in some embodiments.

As discussed with reference to FIGS. 5 and 6, certain components may be shared by multiple main word line drivers MWD. In the example shown in FIG. 7, the MWD 702-708 receive a reference potential VREF. In some embodiments, VREF may be provided by a reference potential source such as reference potential source 602 and/or reference potential source 502. Decoder 710 may be coupled to the MWD 702-708. The decoder 710 may be a tree decoder in some embodiments. In some embodiments, decoder 710 may represent a portion of a decoder, and the remaining portion of the decoder (e.g., transistor 508 and/or transistor 608) may be separately included in each of the MWD 702-708. Thus, in the example shown in FIG. 7, the MWD 702-708 may share a common reference potential source and at least a portion of a decoder.

In some applications, sharing components between the MWD 702-708 may reduce layout requirements for the row decoder circuit 700.

Figure 8:
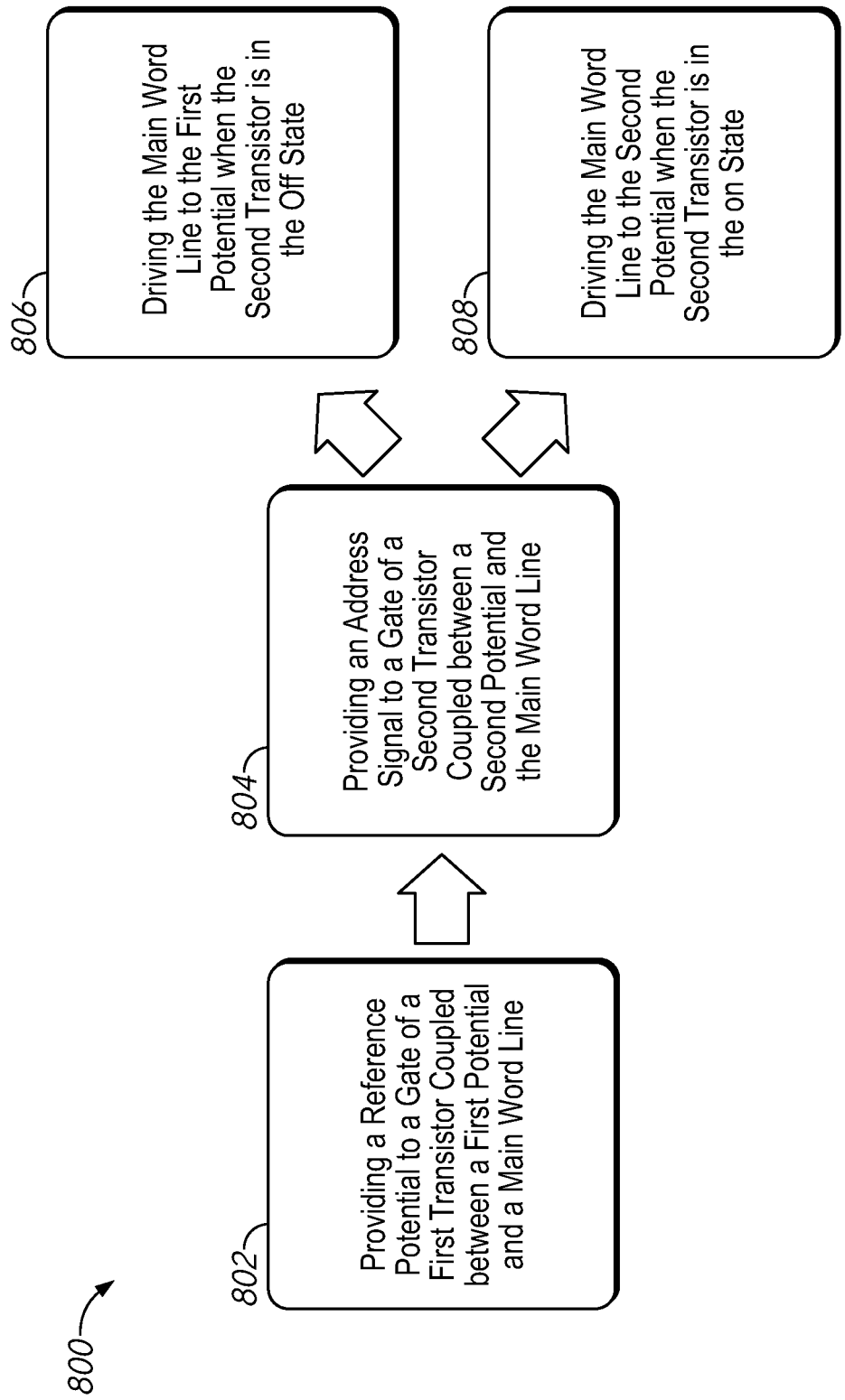
FIG. 8 is a flow chart of a method according to at least one embodiment of the present disclosure.

FIG. 8 is a flow chart of a method according to at least one embodiment of the present disclosure. The method 800 may be performed in whole or in part by semiconductor device 10 in some embodiments. In some embodiments, the method 800 may be performed in whole or in part by the main word line drivers MWD 44 of FIG. 1, MWD of FIG. 2, MWD 0-n of FIG. 3, MWD 500 of FIG. 5, MWD 600 of FIG. 6, and/or MWD 702-708 of FIG. 7.

At block 802, "providing a reference potential to a gate of a first transistor coupled between a first potential and a main word line" may be performed. In some embodiments, the reference potential is configured to put the first transistor in a high resistance state. In some embodiments, the reference potential may be provided by a reference potential source, such as reference potential source 502 and/or 602. Optionally, a second potential may be provided to the gate of the first transistor when an enable signal is in a first state and the reference potential is provided when the enable signal is in a second state.

At block 804 "providing an address signal to a gate of a second transistor coupled between a second potential and the main word line" may be performed. The second transistor is in an on state when the address signal is in a first state and in an off state when the address signal is in a second state in some embodiments. In some embodiments, the address signal is based, at least in part, on a row address RA.

When the second transistor is in the off state, block 806 "driving the main word line to the first potential when the second transistor is in the off state" may be performed. When the second transistor is in the on state, block 808 "driving the main word line to the second potential when the second transistor is in the on state" may be performed.

The MWD disclosed herein may utilize transistors in a high-resistance state to select and unselect the MWL. In some embodiments, fewer transistors may be needed to drive the MWL disclosed herein compared to existing MWD. When the MWD includes fewer transistors, the layout requirements of the MWD disclosed herein may be reduced compared to MWD with more transistors.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
a main word line;
a first transistor coupled between a first potential and the main word line, wherein the first transistor is configured to be in an on state when a first address signal provided to a gate of the first transistor is in a first state and configured to be in an off state when the first address signal is in a second state;
a second transistor coupled between the first potential and the main word line, wherein the second transistor is configured to be in a high resistance state; and
a third transistor coupled between a second potential and the main word line, wherein the third transistor is configured to be in an on state when the first address signal provided to a gate of the third transistor is in the second state and configured to be in an off state when the address signal is in the first state,
wherein the main word line is driven to the first potential when the first transistor is in the on state.

2. The apparatus of claim 1, further comprising a decoder coupled between the third transistor and the second potential configured to receive a second address signal, wherein the decoder is configured to couple the third transistor to the second potential, based, at least in part on a state of the second address signal, wherein the main word line is driven to the second potential when the second address is in a first state and the third transistor is in an on state.

3. The apparatus of claim 2, further comprising a reference potential source configured to provide a reference potential to a gate of the second transistor.

4. The apparatus of claim 1, wherein the first transistor and the second transistor each comprise a P-channel device.

5. The apparatus of claim 1, wherein the third transistor comprises an N-channel device.

6. The apparatus of claim 1, further comprising:
a plurality of main word lines; and a plurality of main word line drivers coupled to corresponding ones of the plurality of main word lines, each of the plurality of main word line drivers comprising the first transistor, the second transistor, and the third transistor.

7. The apparatus of claim 6, further comprising a decoder coupled between the second potential and the third transistor of each of the plurality of main word line drivers.

8. The apparatus of claim 6, further comprising a reference potential source configured to provide a reference potential to a gate of the second transistor of each of the plurality of main word line drivers.

9. A method comprising:
providing a reference potential to a gate of a first transistor coupled between a first potential and a main word line, wherein the reference potential is configured to put the first transistor in a high resistance state;
providing an address signal to a gate of a second transistor coupled between a second potential and the main word line, wherein the second transistor is in an on state when the address signal is in a first state and in an off state when the address signal is in a second state; and
driving the main word line to:
the first potential when the second transistor is in the off state; or
the second potential when the second transistor is in the on state.

10. The method of claim 9, wherein the address signal is based, at least in part, on a row address.

\* \* \* \* \*